United States Patent
Suwa et al.

(10) Patent No.: US 6,812,879 B2
(45) Date of Patent: Nov. 2, 2004

(54) D/A CONVERTER FOR CONVERTING PLURALITY OF DIGITAL SIGNALS SIMULTANEOUSLY

(75) Inventors: Naoko Suwa, Tokyo (JP); Yasuo Morimoto, Tokyo (JP)

(73) Assignee: Renesas Technology Corporation, Tokyo (JP)

(*) Notice: Subject to any disclaimer, the term of this patent is extended or adjusted under 35 U.S.C. 154(b) by 0 days.

(21) Appl. No.: 10/460,199

(22) Filed: Jun. 13, 2003

(65) Prior Publication Data

US 2004/0125004 A1 Jul. 1, 2004

(30) Foreign Application Priority Data

Dec. 25, 2002 (JP) ........................................ 2002-375039

(51) Int. Cl.[7] .............................................. H03M 1/66
(52) U.S. Cl. ...................................... 341/144; 341/153
(58) Field of Search ................................ 341/144, 153, 341/145

(56) References Cited

U.S. PATENT DOCUMENTS

| | | | | |
|---|---|---|---|---|
| 4,752,767 A | * | 6/1988 | Maio et al. | 341/148 |
| 5,745,064 A | * | 4/1998 | Ohya | 341/144 |
| 5,760,725 A | * | 6/1998 | Yoshida et al. | 341/144 |
| 5,841,384 A | * | 11/1998 | Herman et al. | 341/138 |
| 5,949,362 A | * | 9/1999 | Tesch et al. | 341/144 |
| 6,295,012 B1 | * | 9/2001 | Greig | 341/136 |
| 6,346,899 B1 | * | 2/2002 | Hadidi | 341/144 |
| 6,407,688 B1 | * | 6/2002 | Greig | 341/136 |
| 6,433,721 B2 | * | 8/2002 | Katada | 341/144 |
| 6,452,527 B2 | * | 9/2002 | Takeya et al. | 341/144 |
| 6,639,533 B2 | * | 10/2003 | Moon | 341/144 |

FOREIGN PATENT DOCUMENTS

| | | | | |
|---|---|---|---|---|
| EP | 0135274 | * | 7/1984 | ............ H03M/1/80 |
| JP | 6-152424 | | 5/1994 | |

OTHER PUBLICATIONS

Takahiro Miki et al., "An 80–MHZ 8–bit CMOS D/A Converter," IEEE Journal of Solid State Circuits, Dec. 1986, pp. 983–988, vol. SC–21, No. 6.

* cited by examiner

Primary Examiner—Peguy JeanPierre
(74) Attorney, Agent, or Firm—Burns, Doane, Swecker & Mathis, L.L.P.

(57) ABSTRACT

A D/A converter can convert M digital signals to M analog signals simultaneously in accordance with used conditions, where M is an integer greater than one. The D/A converter includes a current matrix cell, N weighting cells, and a control circuit, where N is an integer equal to or greater than M. The control circuit divides the current matrix cell in accordance with the number M of digital signals to be D/A converted, and supplies the current matrix cell after the division with specified bits constituting the M digital signals. The control circuit also supplies only the M weighting cells out of the N weighting cells with the remaining bits of the individual M digital signals. The M analog signals are obtained by adding the M currents the current matrix cell produces and the M currents the M weighting cells produce.

8 Claims, 13 Drawing Sheets

US 6,812,879 B2

D/A CONVERTER FOR CONVERTING PLURALITY OF DIGITAL SIGNALS SIMULTANEOUSLY

BACKGROUND OF THE INVENTION

1. Field of the Invention

The present invention relates to a D/A converter for converting a plurality of digital signals to analog signals.

2. Description of Related Art

To improve D/A conversion accuracy, some conventional D/A converters include a weighting cell for D/A converting a few lower-order bits of a digital signal in addition to a current matrix cell for D/A converting a few higher-order bits of the digital signal (see, Relevant Reference 1 below).

Incidentally, a digital signal processing IC sometimes switches analog signals to be output by switching an internal mode in accordance with its used conditions. In this case, the digital signal processing IC must be equipped with D/A converters corresponding to the maximum number of analog signals to be output simultaneously.

For example, the digital signal processing IC switches between two analog output signals such as (Y output, C output), three analog output signals'such as (R output, G output, B output) and (Y output, U output, V output), and four analog output signals such as (Y output, C output, Y/C output, Y/C output) in response to the internal mode.

Relevant Reference 1: Japanese patent application laid-open No. 6-152424/1994 (paragraph No. [0040] to [0055], and FIG. 1), which is incorporated herein by reference.

With the foregoing configuration, the conventional D/A converter can improve the D/A conversion accuracy. However, it has a problem of being unable to convert a plurality of digital signals into analog signals simultaneously.

Accordingly, the digital signal processing IC must be equipped with a plurality of D/A converters, which presents a problem in that a layout area of the digital signal processing IC increases.

SUMMARY OF THE INVENTION

The present invention is implemented to solve the foregoing problem. It is therefore an object of the present invention to provide a D/A converter capable of converting a plurality of digital signals into analog signals simultaneously in accordance with used conditions.

According to one aspect of the present invention, there is provided a D/A converter including a current matrix cell, N weighting cells, a control circuit, and an output circuit, where N is an integer equal to or greater than two. The control circuit divides the current matrix cell in accordance with the number M of digital signals to be D/A converted, where M is an integer equal to or less than N, and supplies the current matrix cell after the division with specified bits constituting the M digital signals. The control circuit also supplies only the M weighting cells out of the N weighting cells with the remaining bits of the individual M digital signals. M analog signals are obtained by adding the M currents the current matrix cell produces and the M currents the M weighting cells produce. The D/A converter offers an advantage of being able to convert M digital signals to M analog signals simultaneously, in which M is variable in accordance with used conditions.

DETAILED DESCRIPTION OF THE PREFERRED EMBODIMENTS

The invention will now be described with reference to the accompanying drawings.

Embodiment 1

Figure 1:
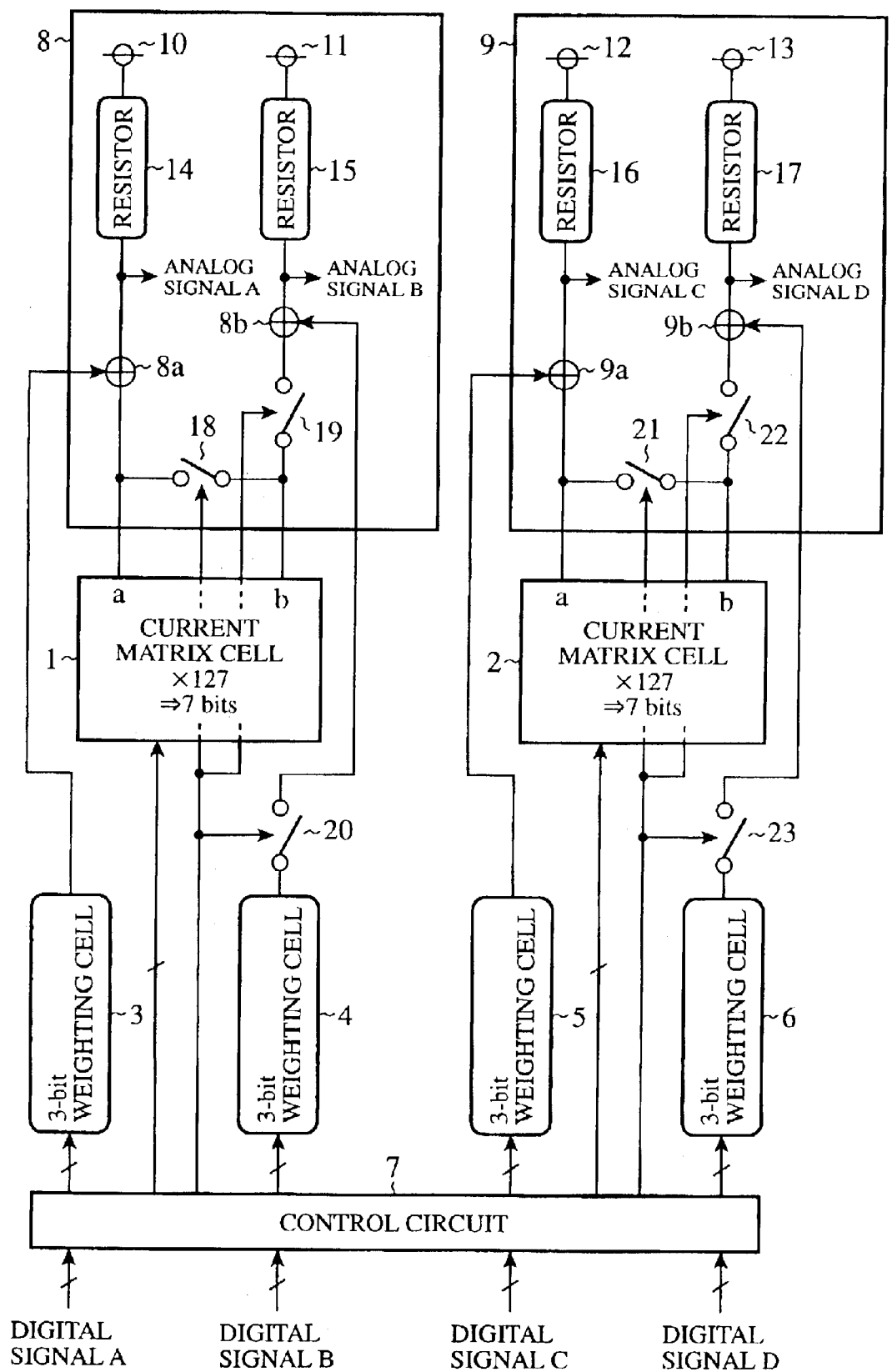
FIG. 1 is a block diagram showing a configuration of an embodiment 1 of the D/A converter in accordance with the present invention.

FIG. 1 is a block diagram showing a configuration of an embodiment 1 of the D/A converter in accordance with the present invention. In FIG. 1, current matrix cells 1 and 2 are each equipped with 127 constant current sources I (see FIG. 5), and output a current with a magnitude corresponding to the bit value of the higher-order seven bits of a digital signal fed from a control circuit 7. On the other hand, weighting cells 3–6 are each equipped with seven constant current sources i, and output a current with a magnitude corresponding to the bit value of the lower-order three bits of the digital signal fed from the control circuit 7.

The control circuit 7 divides the current matrix cells 1 and 2 in accordance with the number of digital signals to be D/A converted, and supplies the current matrix cells after the division with the higher-order seven or six bits of the individual digital signals. The control circuit 7 also supplies only the same number of weighting cells among the weighting cells 3–6 as the number of the digital signals to be D/A converted with the lower-order three bits of the individual digital signals. Output sections 8 and 9 each sum up the output currents of the current matrix cells after the division and the output currents of the same number of the weighting cells, and convert the resultant sums to voltages to be output.

The output section 8 includes adders 8a and 8b, power supplies 10 and 11, resistors 14 and 15 and switches 18 and 19, and the output section 9 includes adders 9a and 9b, power supplies 12 and 13, resistors 16 and 17 and switches 21 and 22. The switches 18–23 are each turned on and off under the control of the control circuit 7.

Next, the operation of the present embodiment 1 will be described.

Figure 2:
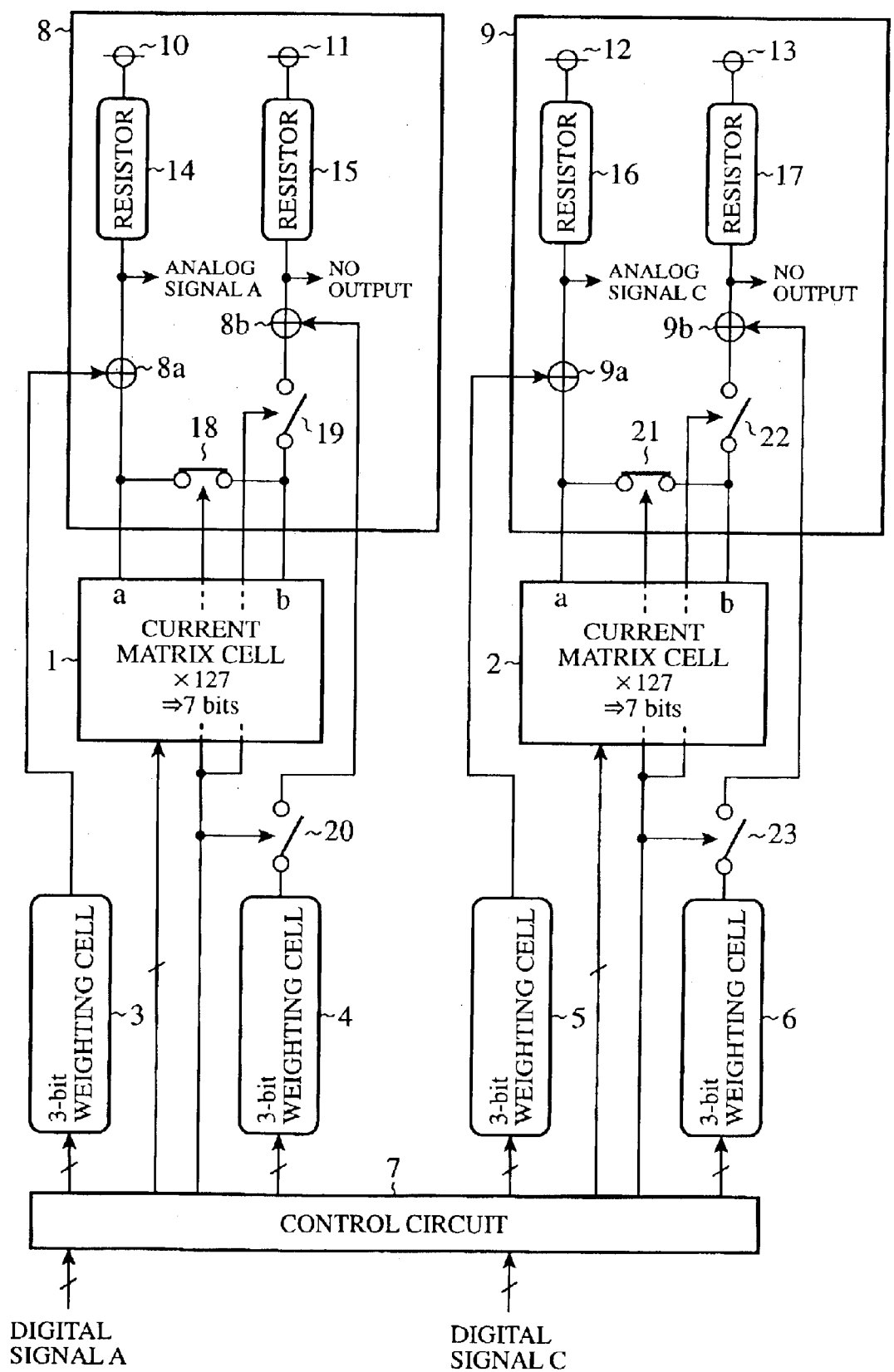
FIG. 2 is a block diagram showing a configuration of a circuit for D/A converting 10-bit digital signals A and C.

First, consider the case where the 10-bit digital signals A and C among digital signals A, B, C and D are D/A converted to be output as analog signals A and C. In this case, the control circuit 7 turns on the switches 18 and 21 and turns off the switches 19, 20, 22 and 23 as shown in FIG. 2.

The control circuit 7 does not divide the current matrix cells 1 and 2, and supplies the current matrix cells 1 and 2 with the higher-order seven bits of the digital signals A and C, respectively. In addition, it supplies the weighting cells 3 and 5 with the lower-order three bits of the digital signals A and C, respectively.

Receiving the higher-order seven bits of the digital signal A from the control circuit 7, the current matrix cell 1 outputs a current with a magnitude corresponding to the bit value of the higher-order seven bits.

Figure 5:
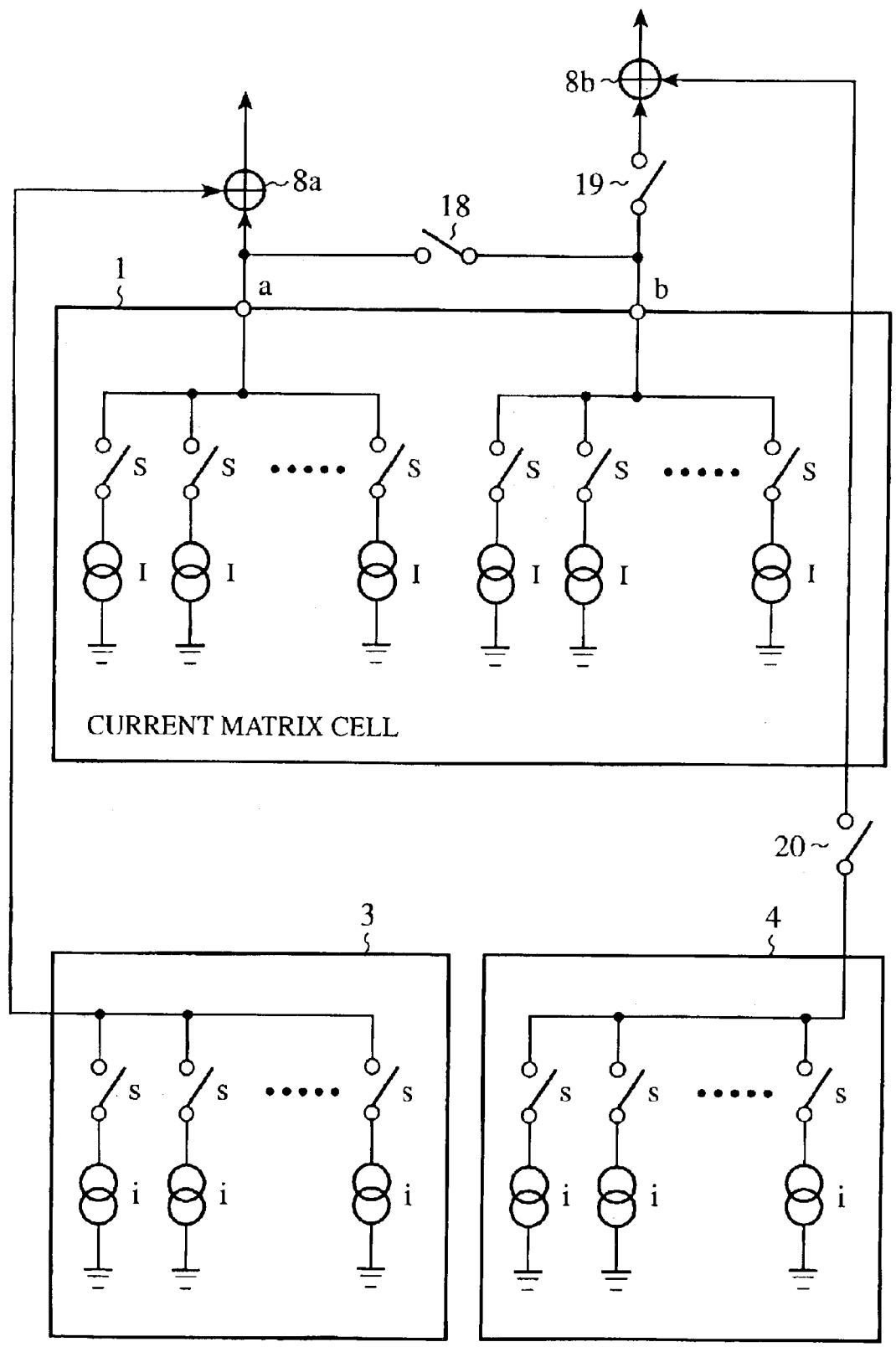
FIG. 5 is a circuit diagram showing an internal configuration of a current matrix cell and weighting cells.

More specifically, as shown in FIG. 5, the current matrix cell 1 includes 63 constant current sources I connected to its terminal a via switches S, and 64 constant current sources I connected to its terminal b via switches S. Thus, it controls the 127 switches S in response to the bit value of the higher-order seven bits to output the current with the magnitude corresponding to the bit value.

For example, when the higher-order seven bits of the digital signal A are all "1", all the switches S are turned on to output the maximum current. In contrast, when the higher-order seven bits are all "0", all the switches S are turned off.

Likewise, receiving the higher-order seven bits of the digital signal C from the control circuit 7, the current matrix cell 2 outputs the current with a magnitude corresponding to the bit value of the higher-order seven bits in the same manner as the current matrix cell 1.

The weighting cell 3, receiving the lower-order three bits of the digital signal A from the control circuit 7, outputs the current with a magnitude corresponding to the bit value of the lower-order three bits.

More specifically, as shown in FIG. 5, the weighting cell 3 includes seven constant current sources i connected to the terminal a of the current matrix cell 1 via the switches S and the adder 8a. Thus, it outputs the current with a magnitude corresponding to the bit value of the lower-order three bits by controlling the seven switches S in response to the bit value.

Likewise, receiving the lower-order three bits of the digital signal C from the control circuit 7, the weighting cell 5 outputs the current with a magnitude corresponding to the bit value of the lower-order three bits in the same manner as the weighting cell 3.

The output section 8 calculates the sum of the currents output from the terminals a and b of the current matrix cell 1, followed by adding the resultant sum and the current output from the weighting cell 3. Then, it converts the resultant sum into a voltage (analog signal A) through the resistor 14, and outputs the analog signal A as the result of the D/A conversion.

Likewise, the output section 9 calculates the sum of the currents output from the terminals a and b of the current matrix cell 2, followed by adding the resultant sum and the current output from the weighting cell 5. Then, it converts the resultant sum into a voltage (analog signal C) through the resistor 16, and outputs the analog signal C as the result of the D/A conversion.

Next, consider the case where 9-bit digital signals A and B and 10-bit digital signal C among the digital signals A, B, C and D are D/A converted to be output as analog signals A, B and C. In this case, the control circuit 7 turns on the switches 19, 20 and 21 and turns off the switches 18, 22 and 23 as shown in FIG. 3.

Although the control circuit 7 does not divide the current matrix cell 2, it divides the current matrix cell 1 into two.

Figure 3:
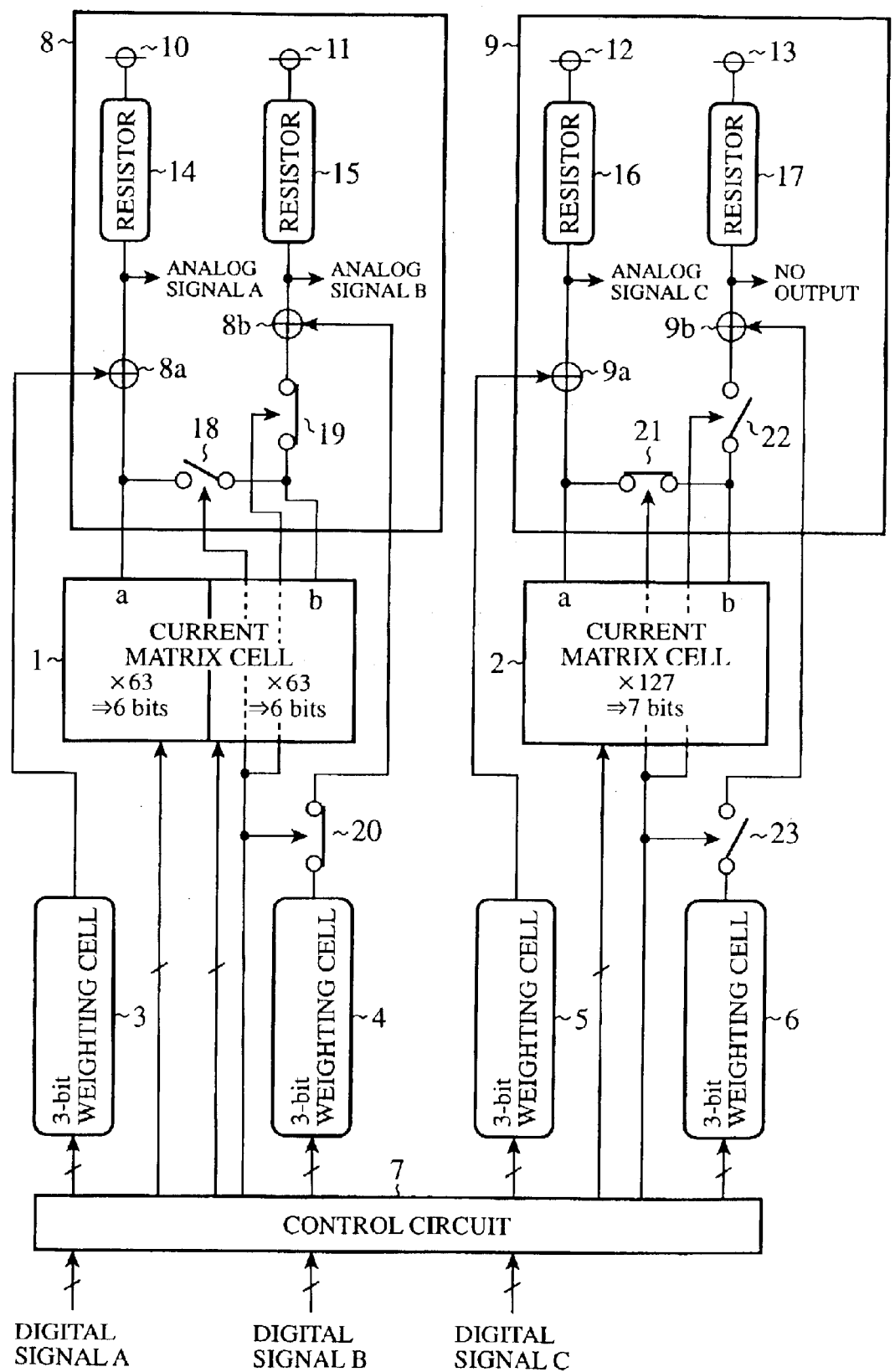
FIG. 3 is a block diagram showing a configuration of a circuit for D/A converting 9-bit digital signals A and B and 10-bit digital signal C.

Then as shown in FIG. 3, the control circuit 7 supplies the higher-order six bits of the digital signal A to the left-hand side of the current matrix cell 1 after the division, the higher-order six bits of the digital signal B to the right-hand side of the current matrix cell 1 after the division, and the higher-order seven bits of the digital signal C to the current matrix cell 2. In addition, it supplies the lower-order three bits of the digital signals A, B and C to the weighting cells 3, 4 and 5, respectively.

Receiving the higher-order six bits of the digital signal A from the control circuit 7, the current matrix cell 1 after the division at the left-hand side of FIG. 3 outputs the current with a magnitude corresponding to the bit value of the higher-order six bits.

More specifically, as shown in FIG. 5, the current matrix cell 1 includes 63 constant current sources I connected to its terminal a via switches S. Thus, it outputs the current with a magnitude corresponding to the bit value of the higher-order six bits by controlling the 63 switches S in response to the bit value.

For example, when the higher-order six bits of the digital signal A are all "1", all the switches S are turned on to output the maximum current. In contrast, when the higher-order six bits are all "0", all the switches S are turned off.

Likewise, receiving the higher-order six bits of the digital signal B from the control circuit 7, the current matrix cell 1 after the division at the right-hand side of FIG. 3 outputs the current with a magnitude corresponding to the bit value of the higher-order six bits.

More specifically, as shown in FIG. 5, the current matrix cell 1 includes 63 constant current sources I connected to its terminal b via switches S. Thus, it outputs the current with a magnitude corresponding to the bit value of the higher-order six bits by controlling the 64 switches S in response to the bit value. In this case, however, one of the 64 switches S always maintains the off state regardless of the bit value of the higher-order six bits.

The weighting cell 3, receiving the lower-order three bits of the digital signal A from the control circuit 7, outputs the current with a magnitude corresponding to the bit value of the lower-order three bits.

The weighting cell 4, receiving the lower-order three bits of the digital signal B from the control circuit 7, outputs the current with a magnitude corresponding to the bit value of the lower-order three bits.

The weighting cell 5, receiving the lower-order three bits of the digital signal C from the control circuit 7, outputs the current with a magnitude corresponding to the bit value of the lower-order three bits.

The output section 8 calculates the sum of the current output from the terminal a of the current matrix cell 1 and the current output from the weighting cell 3, converts the resultant sum into a voltage (analog signal A) through the resistor 14, and outputs the analog signal A as the result of the D/A conversion.

In addition, it calculates the sum of the current output from the terminal b of the current matrix cell 1 and the current output from the weighting cell 4, converts the resultant sum into a voltage (analog signal B) through the resistor 15, and outputs the analog signal B as the result of the D/A conversion.

The output section 9 calculates the sum of the currents output from the terminals a and b of the current matrix cell 2, followed by adding the resultant sum and the current output from the weighting cell 5. Then, it converts the resultant sum into a voltage (analog signal C) through the resistor 16, and outputs the analog signal C as the result of the D/A conversion.

Next, consider the case where the 9-bit digital signals A, B, C and D are D/A converted to be output as analog signals A, B, C and D. In this case, the control circuit 7 turns on the switches 19, 20, 22 and 23 and turns off the switches 18 and 21 as shown in FIG. 4.

The control circuit 7 divides each of the current matrix cells 1 and 2 into two.

Figure 4:
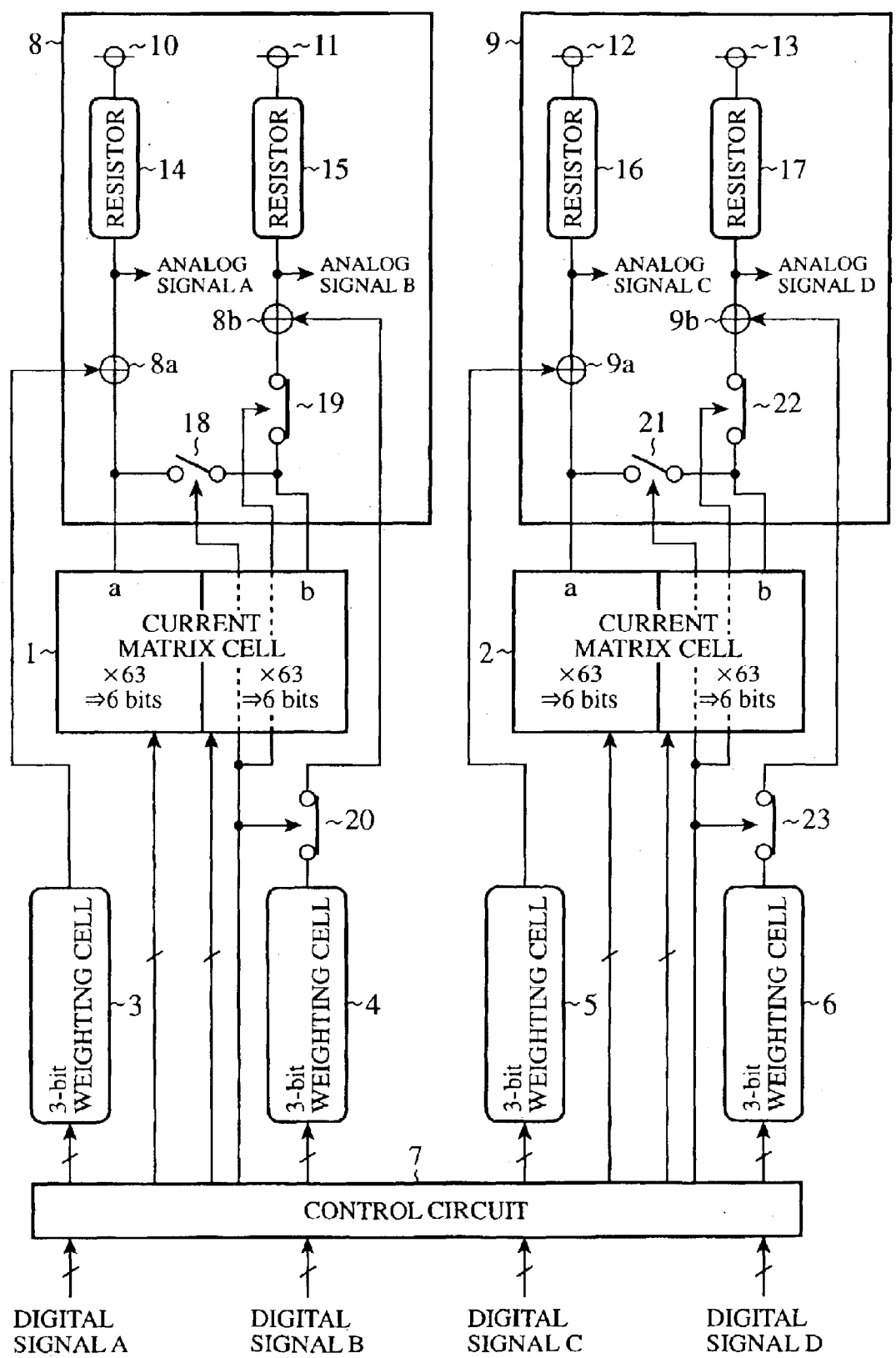
FIG. 4 is a block diagram showing a configuration of a circuit for D/A converting 9-bit digital signals A, B, C and D.

Then as shown in FIG. 4, the control circuit 7 supplies the higher-order six bits of the digital signal A to the left-hand side of the current matrix cell 1 after the division, the higher-order six bits of the digital signal B to the right-hand side of the current matrix cell 1 after the division, the higher-order six bits of the digital signal C to the left-hand side of the current matrix cell 2 after the division, and the higher-order six bits of the digital signal D to the right-hand side of the current matrix cell 2 after the division. In addition, the control circuit 7 supplies the lower-order three bits of the digital signals A, B, C and D to the weighting cells 3, 4, 5 and 6, respectively.

Receiving the higher-order six bits of the digital signal A from the control circuit 7, the current matrix cell 1 after the division at the left-hand side of FIG. 4 outputs the current with a magnitude corresponding to the bit value of the higher-order six bits.

Receiving the higher-order six bits of the digital signal B from the control circuit 7, the current matrix cell 1 after the division at the right-hand side of FIG. 4 outputs the current with a magnitude corresponding to the-bit value of the higher-order six bits.

Receiving the higher-order six bits of the digital signal C from the control circuit 7, the current matrix cell 2 after the division at the left-hand side of FIG. 4 outputs the current with a magnitude corresponding to the bit value of the higher-order six bits.

Receiving the higher-order six bits of the digital signal D from the control circuit 7, the current matrix cell 2 after the division at the right-hand side of FIG. 4 outputs the current with a magnitude corresponding to the bit value of the higher-order six bits.

The weighting cell 3, receiving the lower-order three bits of the digital signal A from the control circuit 7, outputs the current with a magnitude corresponding to the bit value of the lower-order three bits.

The weighting cell 4, receiving the lower-order three bits of the digital signal B from the control circuit 7, outputs the current with a magnitude corresponding to the bit value of the lower-order three bits.

The weighting cell 5, receiving the lower-order three bits of the digital signal C from the control circuit 7, outputs the current with a magnitude corresponding to the bit value of the lower-order three bits.

The weighting cell 6, receiving the lower-order three bits of the digital signal D from the control circuit 7, outputs the current with a magnitude corresponding to the bit value of the lower-order three bits.

The output section 8 calculates the sum of the current output from the terminal a of the current matrix cell 1 and the current output from the weighting cell 3, converts the resultant sum into a voltage (analog signal A) through the resistor 14, and outputs the analog signal A as the result of the D/A conversion.

In addition, it calculates the sum of the current output from the terminal b of the current matrix cell 1 and the current output from the weighting cell 4, converts the resultant sum into a voltage (analog signal B) through the resistor 15, and outputs the analog signal B as the result of the D/A conversion.

The output section 9 calculates the sum of the current output from the terminal a of the current matrix cell 2 and the current output from the weighting cell 5, converts the resultant sum into a voltage (analog signal C) through the resistor 16, and outputs the analog signal C as the result of the D/A conversion.

In addition, it calculates the sum of the current output from the terminal b of the current matrix cell 2 and the current output from the weighting cell 6, converts the resultant sum into a voltage (analog signal D) through the resistor 17, and outputs the analog signal D as the result of the D/A conversion.

As described above, the D/A converter operates as two 10-bit D/A converters producing the two outputs by the control of the control circuit 7 as shown in FIG. 2. It operates as the 10-bit D/A converter plus two 9-bit D/A converters producing the three outputs by the control of the control circuit 7 as shown in FIG. 3. In addition, it operates as the four 9-bit D/A converters producing the four outputs by the control of the control circuit 7 as shown in FIG. 4.

Figure 6:
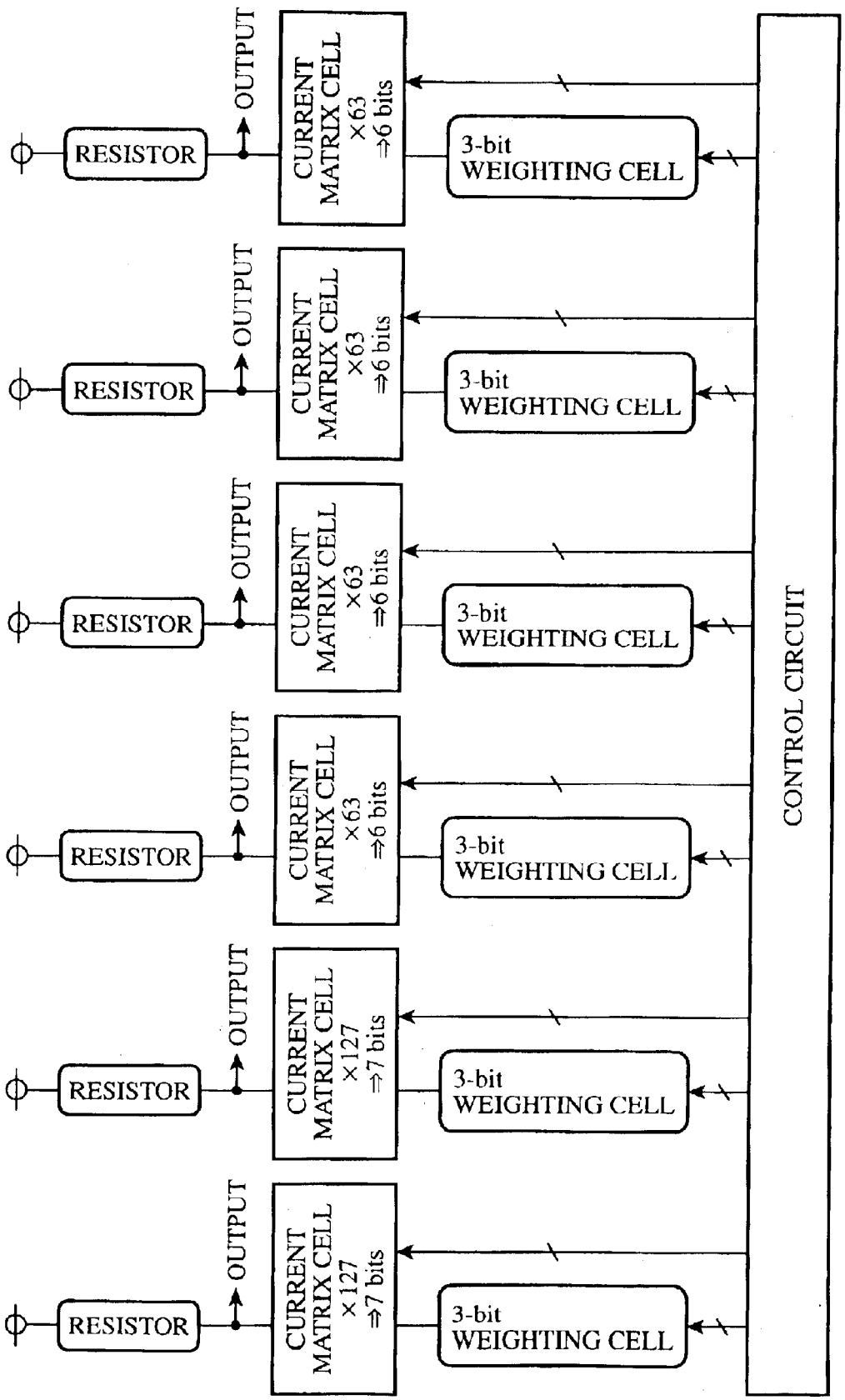
FIG. 6 a block diagram showing a configuration of a conventional circuit for producing multiple outputs.

In contrast, to obtain the foregoing three-type outputs by the conventional device, it must includes two current matrix cells equipped with 127 constant current sources I and four current matrix cells equipped with 63 constant current sources I as shown in FIG. 6. In other words, it must include four extra current matrix cells in addition to those of the embodiment 1. Thus, the present embodiment 1 can reduce the layout area of the digital signal processing IC.

As described above, the present embodiment 1 is configured such that the control circuit 7 divides the current matrix cells 1 and 2 in accordance with the number of the digital signals to be D/A converted, and supplies the current matrix cells after the division with the specified bits of the individual digital signals, and that the control circuit 7 supplies the remaining bits of the individual digital signals only to the same number of the weighting cells among the weighting cells 3–6 as the number of digital signals to be DIA converted. Thus, it offers an advantage of being able to convert a plurality of digital signals to the analog signals simultaneously in accordance with the used conditions.

Although the present embodiment 1 supplies the current matrix cells 1 and 2 with the specified higher-order bits of the digital signals, and the weighting cells 3–6 with the remaining lower-order bits of the digital signals, this is not essential. For example, it can supply the current matrix cells 1 and 2 with specified lower-order bits of the digital signals, and the weighting cells 3–6 with the remaining higher-order bits of the digital signals.

Embodiment 2

Figure 7:
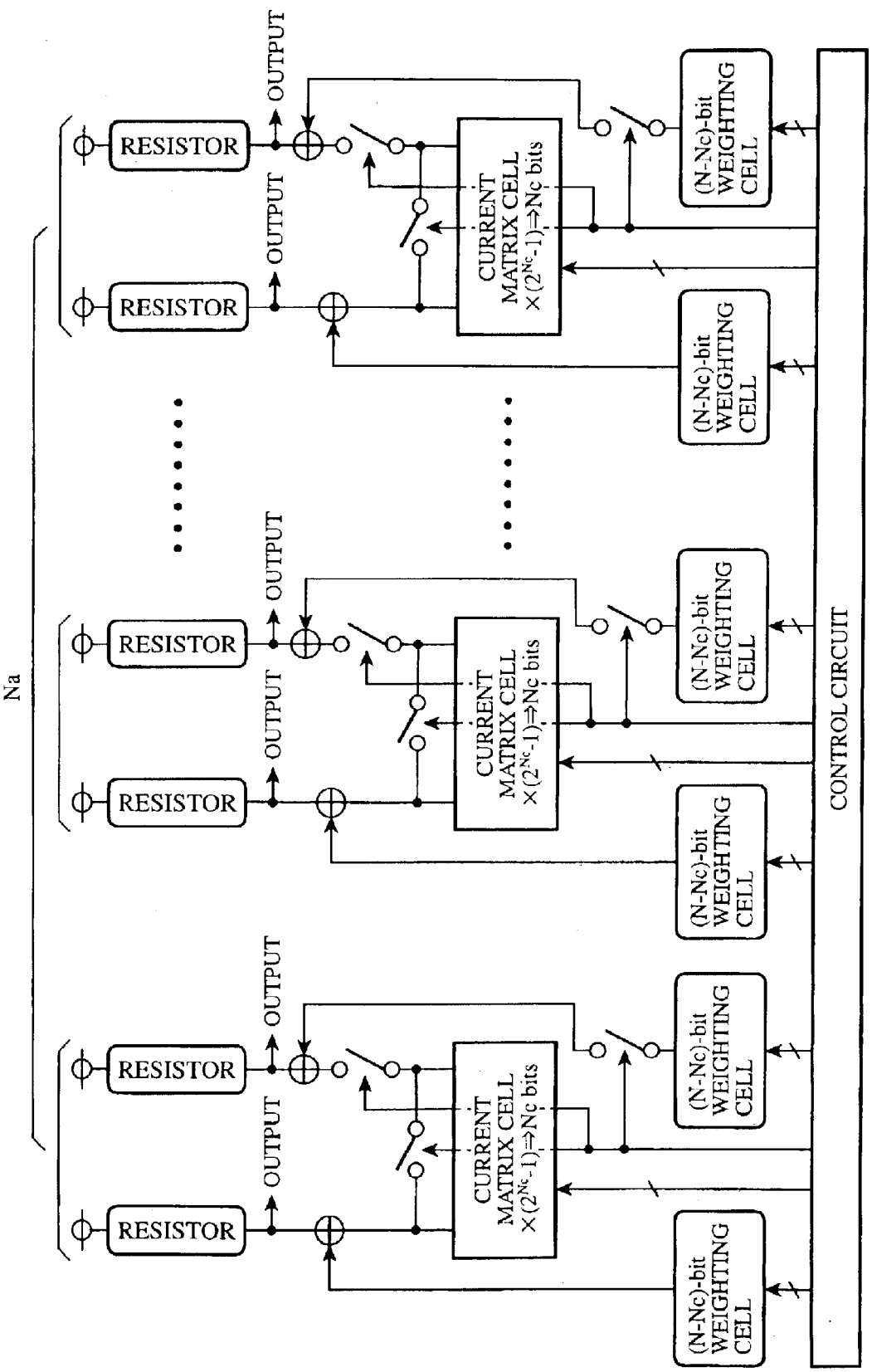
FIG. 7 is a block diagram showing a configuration of an embodiment 2 of the D/A converter in accordance with the present invention.

Although the foregoing embodiment 1 includes the two current matrix cells each equipped with the 127 constant current sources I, and the four weighting cells each equipped with the seven constant current sources i, this is not essential. For example, as shown in FIG. 7, it can include Na Nc-bit current matrix cells equipped with ($2^{Nc}-1$) constant current sources I, and 2×Na (N−Nc)-bit weighting cells, offering the same advantage as that of the foregoing embodiment 1.

In this case, one of the following outputs can be obtained by appropriated control by the control circuit.
(a) N-bit D/A converters: Na outputs
(b) (N−1)-bit D/A converters: 2×(N−Nb) outputs+N-bit D/A converters: Nb outputs
(c) (N−1)-bit D/A converters: 2×Na outputs where Nb can be set arbitrarily in the range 1≦Nb≦Na.

Embodiment 3

Although each current matrix cell is connected to the two weighting cells in the foregoing embodiments 1 and 2, this is not essential. For example, each current matrix cell can be connected to three or more weighting cells.

Figure 8:
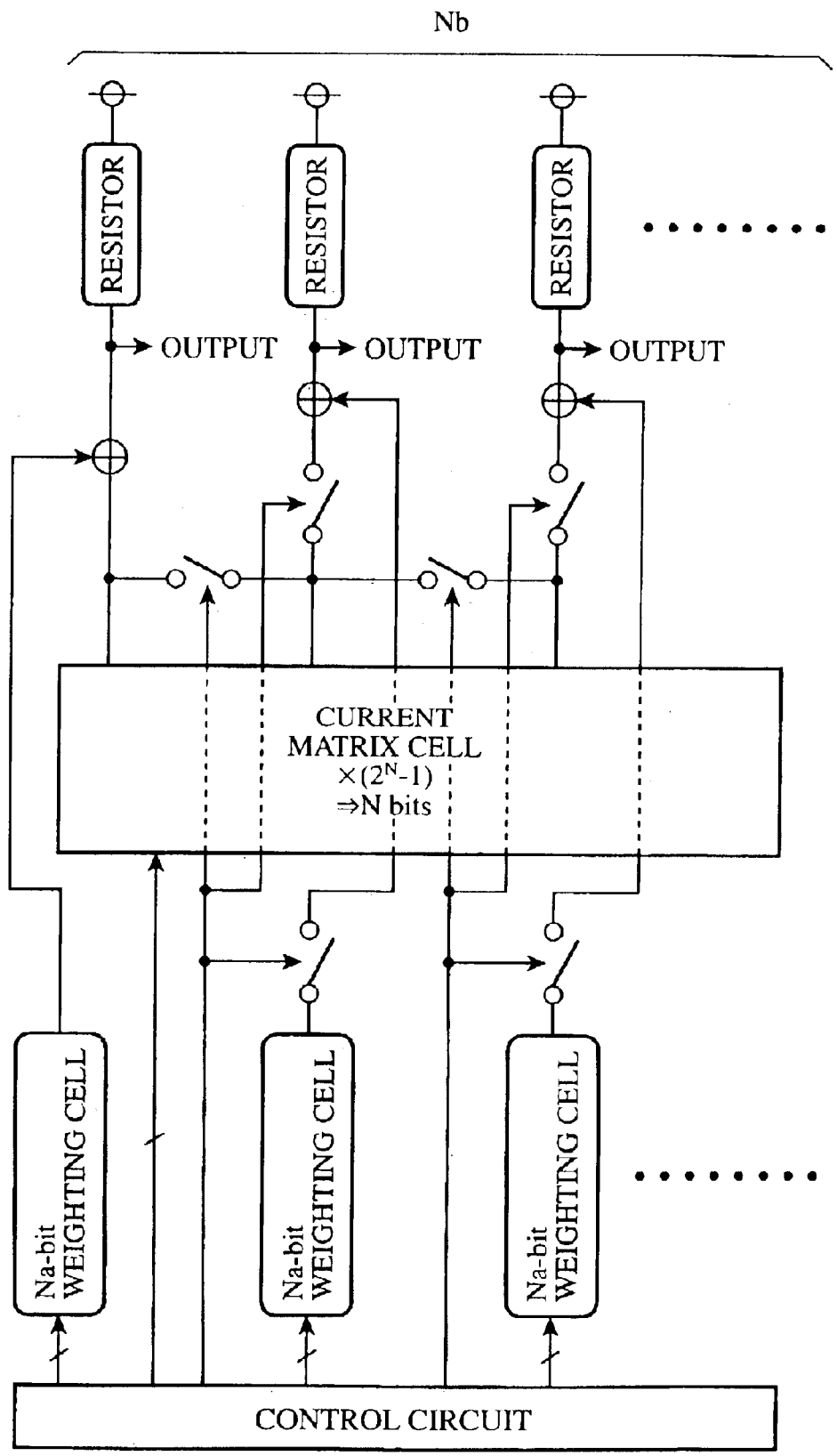
FIG. 8 is a block diagram showing a configuration of an embodiment 3 of the D/A converter in accordance with the present invention.

For example, as shown in FIG. 8, the D/A converter can include one N-bit current matrix cell equipped with ($2^N-1$) constant current sources I and Nb Na-bit weighting cells, offering the same advantage as that of the foregoing embodiments 1 and 2.

In this case, one of the following outputs can be obtained by appropriate control of the control circuit.

| (a) | (N+Na)-bit D/A converter: one output |
|---|---|
| (b) | (N−1+Na)-bit D/A converters: two outputs |
| (c) | (N−2+Na)-bit D/A converters: three outputs |
| ... | |
| (m) | (N−Nb+1+Na)-bit D/A converters: Nb outputs |

Since it holds true that the layout area of the (N+Na)-bit D/A converter is much greater than that of the Na-bit weighting circuits in the range N>Na, the foregoing combinations can be switched nearly within the layout area of the (N+Na)-bit D/A converter. Thus, the present embodiment 3 offers an advantage of being able to reduce the layout area sharply.

Embodiment 4

Although a plurality of weighting cells with the same bit number are connected to the single current matrix cell in the foregoing embodiment 3, this is not essential. For example, a plurality of weighting cells with different bit numbers can be connected to a single current matrix cell.

Figure 9:
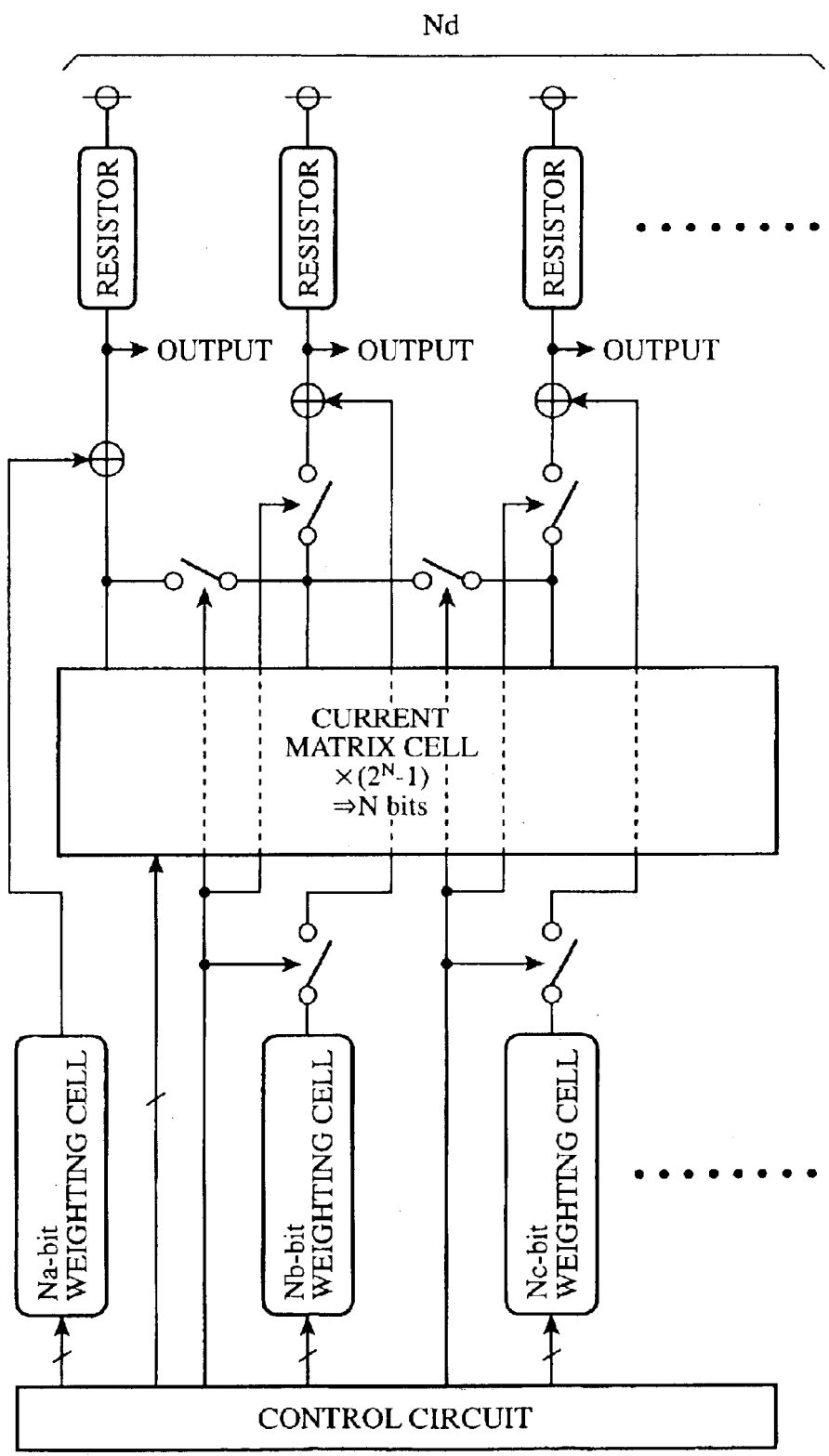
FIG. 9 is a block diagram showing a configuration of an embodiment 4 of the D/A converter in accordance with the present invention.

More specifically, as shown in FIG. 9, (Na-bit, Nb-bit, Nc-bit, . . . ) weighting cells are connected to an N-bit current matrix cell equipped with. ($2^N-1$) constant current sources I.

In this case, one of the following outputs can be achieved by controlling appropriately by the control circuit.

| (a) | one output: (N+Na)-bit, (N+Nb)-bit, (N+Nc)-bit, . . . |
|---|---|
| (b) | two outputs: (N−1+Na)-bit or (N−1+Nb)-bit, (N−1+Na)-bit or (N−1+Nc)-bit, (N−1+Nb)-bit or (N−1+Nc)-bit, |
| (c) | three outputs: (N−2+Na)-bit or (N−2+Nb)-bit or (N−2+Nc)-bit, |
| (d) | Nd outputs: (N−Nd+1+Na)-bit or (N−Nd+1+Nb)-bit or (N−Nd+1+Nc) -bit or ... |

According to the present embodiment 4, the plurality of weighting cells equipped with the different numbers of constant current sources are connected to the current matrix cell. Thus, it offers an advantage of being able to increase the types of bit numbers of the D/A converter.

Embodiment 5

Although the foregoing embodiment 1 does not mention in particular, the control circuit 7 can switch the internal resistances of the output sections 8 and 9 in accordance with the numbers of the divisions of the current matrix cells 1 and 2, so that the voltages (the amplitudes of the analog signals A–D) the output sections 8 and 9 produce become constant when the digital signals A–D take a maximum value.

Figure 10:
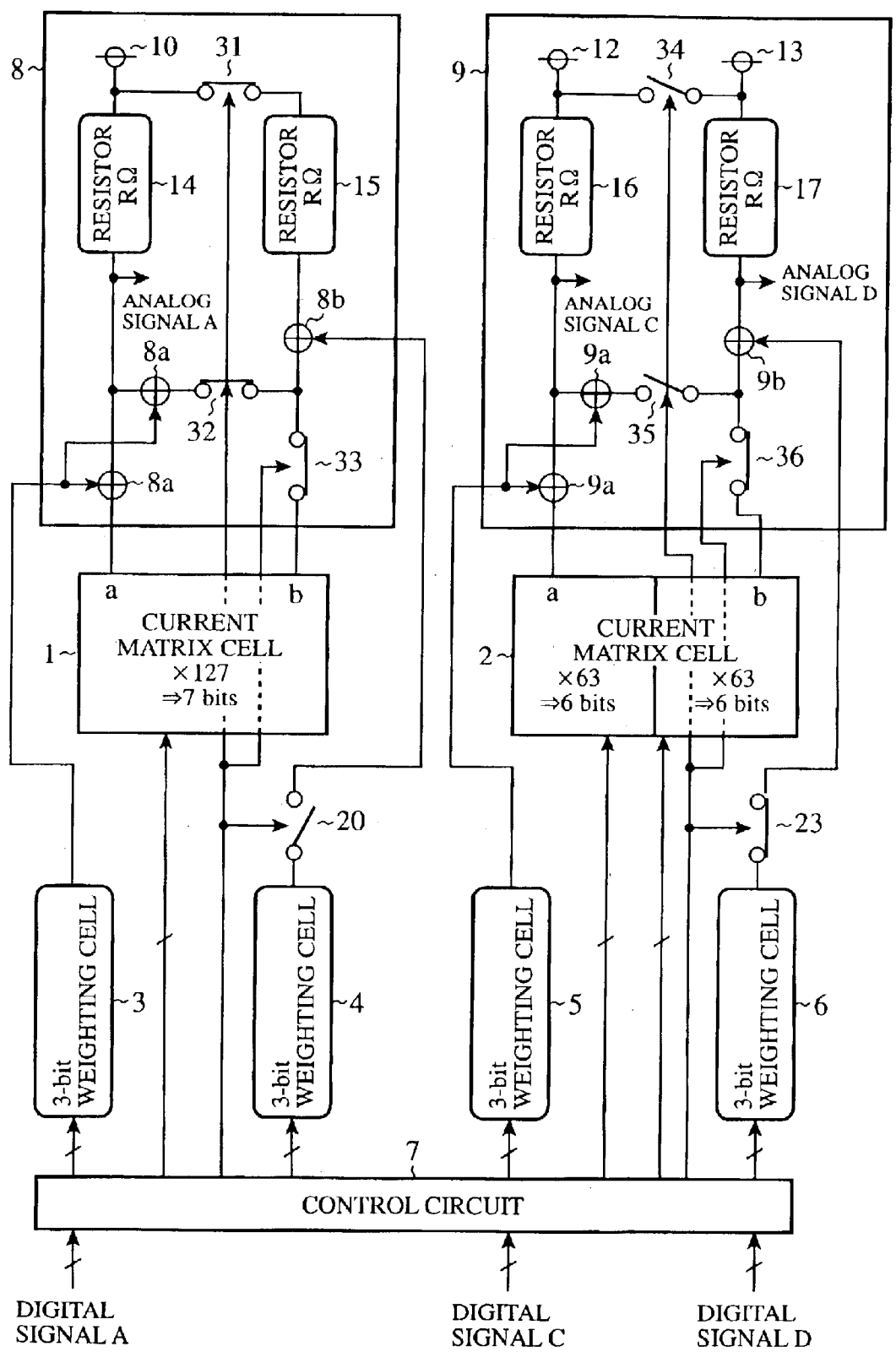
FIG. 10 is a block diagram showing a configuration of an embodiment 5 of the D/A converter in accordance with the present invention.

More specifically, as shown in FIG. 10, the output sections 8 and 9 are configured using two resistors 14 and 15, and 16 and 17 with a resistance of RΩ, and three switches 31–33, and 34–36, respectively.

For example, to provide one 10-bit D/A converter output and two 9-bit D/A converter outputs, or more specifically, to produce analog signals A, C and D by D/A converting the 10-bit digital signal A and the 9-bit digital signals C and D, the control circuit 7 turns on the switches 23, 31, 32, 33 and 36, and turns off the switches 20, 34 and 35. Here, assume that the output values of the weighting cells 3 and 5 are "1" for the sake of simplicity.

In this case, if the 10-bit digital signal A takes a maximum value (full-scale value), all the constant current sources I of the current matrix cell 1 output the current. Assume that the output current of the current matrix cell 1 is 2×I in this case.

Since the resistors 14, and 15 of the output section 8 are connected in parallel, the internal resistance of the output section 8 is R/2. Thus, the voltage (the amplitude of the analog signal A) the output section 8 outputs becomes I×R.

On the other hand, if the 9-bit digital signal C takes a maximum value (full-scale value), all the constant current sources I of the left-hand side of the current matrix cell 2 after the division of FIG. 10 output the current. In this case, the output current of the left-hand side of the current matrix cell 2 after the division is I.

Since the resistors 14 and 15 of the output section 9 are disconnected, the internal resistance of the output section 9 is R. Thus, the voltages (amplitudes of the analog signals) the output section 9 outputs become I×R.

As described above, the present embodiment 5 offers an advantage of being able to equalize the amplitude of the analog signal corresponding to the maximum 10-bit digital signal with the amplitudes of the analog signals corresponding to the maximum 9-bit digital signals.

Embodiment 6

Figure 11:
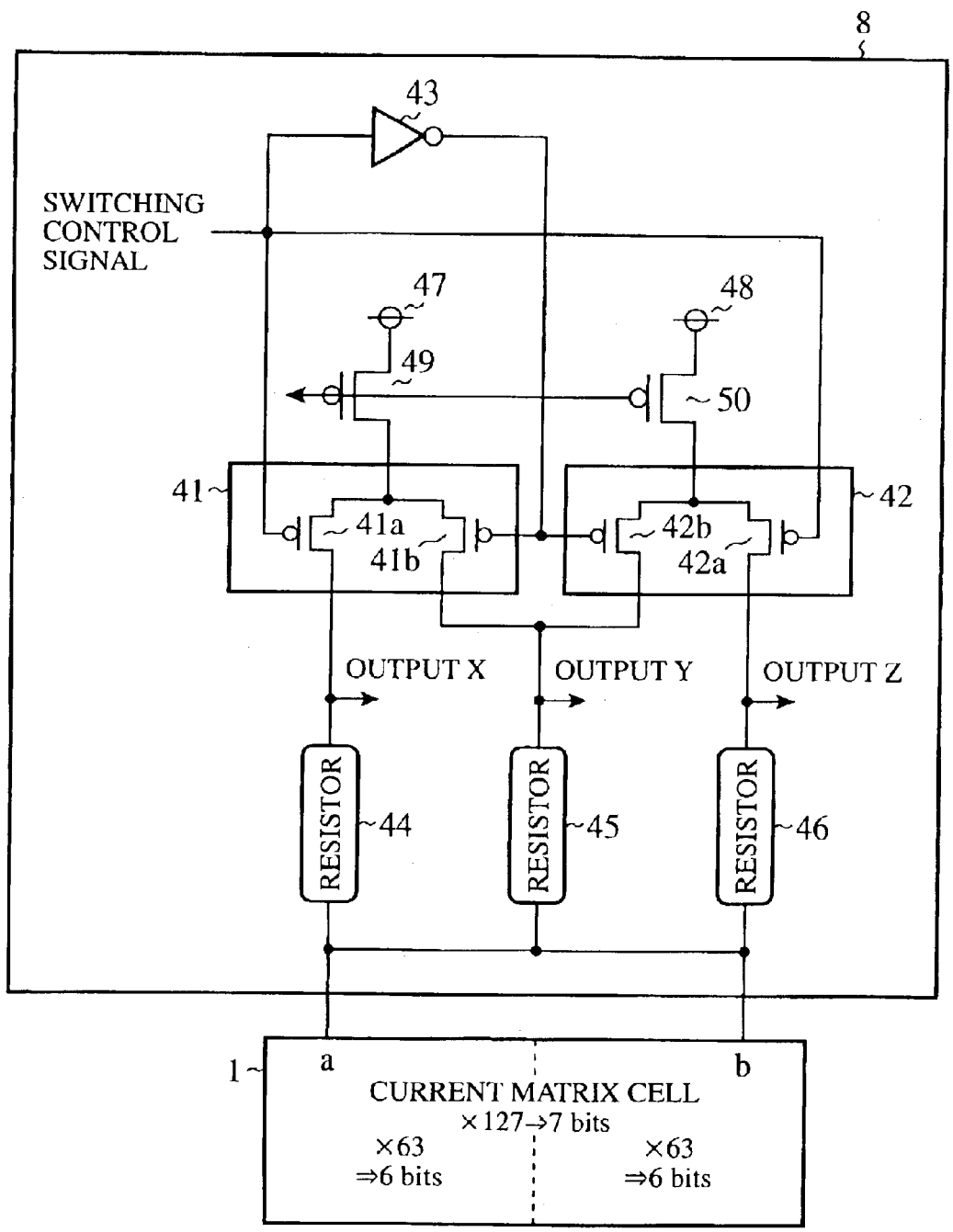
FIG. 11 is a circuit diagram showing a configuration of an embodiment 6 of the D/A converter in accordance with the present invention.

Although the foregoing embodiment 1 configures the output sections 8 and 9 using the switches 18 and 19, this is not essential. For example, as shown in FIG. 11, the output section 8 can be configured using two pairs of differential transistors 41 (41a and 41b) and 42 (42a and 42b). Although the output section 9 is not shown in FIG. 11, it has the same configuration as the output section 8. In FIG. 11, the adders 8a and 8b of the output section 8 are omitted for the sake of simplicity.

In FIG. 11, to output the analog signal A or B by D/A converting the 10-bit digital signal A or B, the control circuit 7 supplies the output section 8 with a switching control signal indicating that.

In response to the switching control signal, the P-channel transistors 41a and 42a of the two pairs of the differential transistors 41 and 42 are brought out of conduction. In contrast, because of an inverter 43 connected to their gates, the P-channel transistors 41b and 42b are brought into conduction.

Thus, the terminals a and b of the current matrix cell 1 are connected to the power supplies 47 and 48 through the resistor 45 and P-channel transistors 41b and 49, and 42b and 50, respectively. Consequently, the output Y produces the analog signal A or B.

On the other hand, to output the analog signals A and B by D/A converting the 9-bit digital signals A and B, the control circuit 7 supplies the output section 8 with the switching control signal indicating that.

In response to the switching control signal, the P-channel transistors 41a and 42a of the two pairs of the differential transistors 41 and 42 are brought into conduction. In contrast, because of the inverter 43 connected to their gates, the P-channel transistors 41b and 42b are brought out of conduction.

Accordingly, the terminal a of the current matrix cell 1 is connected to the power supply 47 via the resistor 44 and the P-channel transistors 41a and 49. Thus, the analog signal A is output from the output X.

In addition, the terminal b of the current matrix cell 1 is connected to the power supply 48 via the resistor 46 and the P-channel transistors 42a and 50. Thus, the analog signal B is output from the output Z.

As described above, the present embodiment 6 can remove the switches 18 and 19 and the like from the passages of the current flowing in the output sections 8 and 9. As a result, it offers an advantage of being able to eliminate the adverse effect of the resistance of the switches 18 and 19 and the like on the D/A converter.

Embodiment 7

Figure 12:
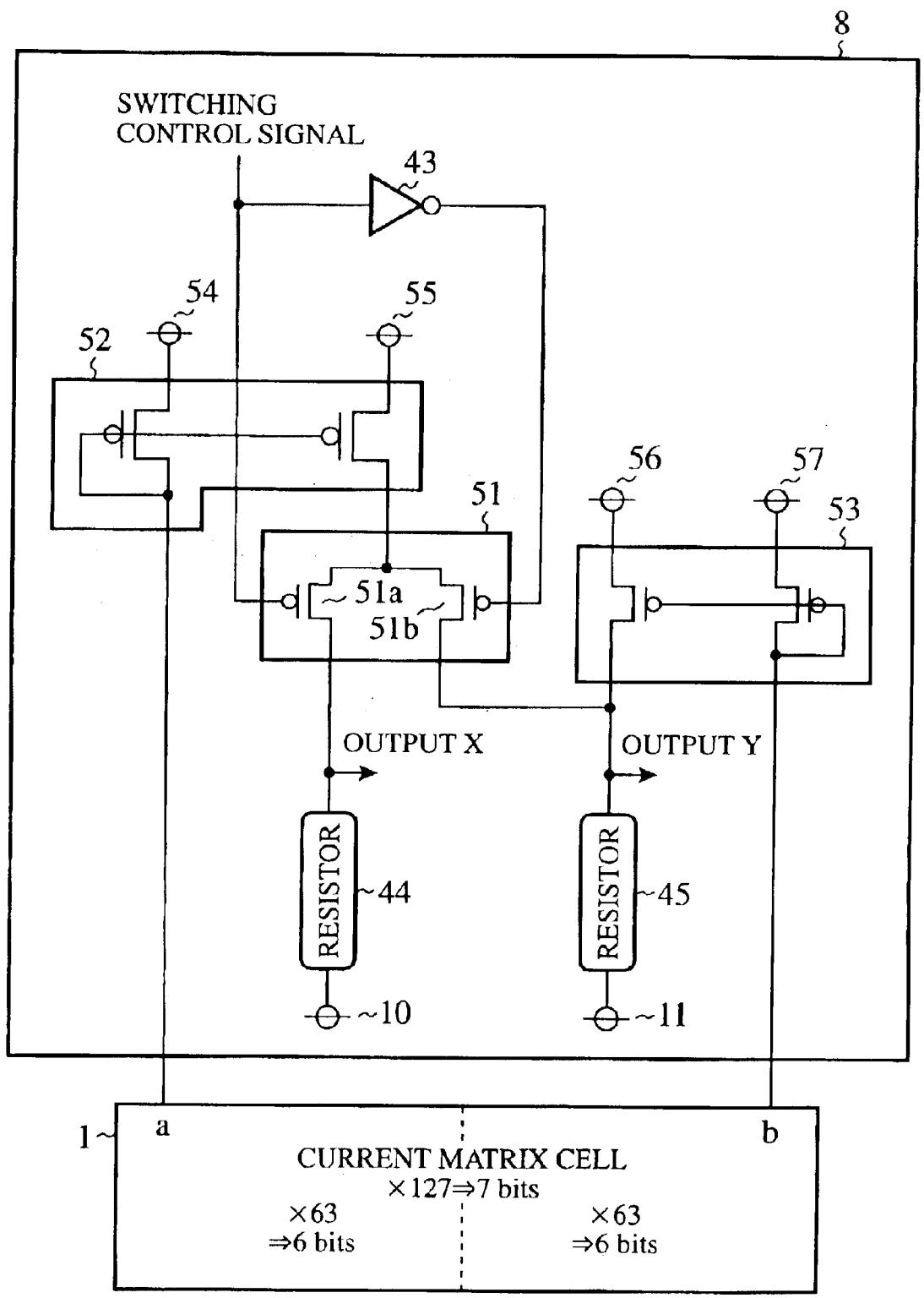
FIG. 12 is a block diagram showing a configuration of an embodiment 7 of the D/A converter in accordance with the present invention.

Although the foregoing embodiment 6 configures the output section 8 using the two pairs of the differential transistors 41 and 42, this is not essential. For example, as shown in FIG. 12, the output section 8 can be configured using a pair of differential transistors 51 (51a and 51b) and current mirror circuits 52 and 53. Although not shown in FIG. 12, the output section 9 has the same configuration as the output section 8. In FIG. 12, reference numerals 54–57 each designates a power supply. For the sake of simplicity, the adders 8a and 8b of the output section 8 are not shown in FIG. 12.

In FIG. 12, to output the analog signal A or B by D/A converting the 10-bit digital signal A or B, the control circuit 7 supplies the output section 8 with a switching control signal indicating that.

In response to the switching control signal, a P-channel transistor 51a of the pair of differential transistors 51 is brought out of conduction. In contrast, because of the inverter 43 connected to its gate, a P-channel transistor 51b is brought into conduction.

Accordingly, the current output from the terminal a of the current matrix cell 1 is supplied to the resistor 45 through the current mirror circuit 52. In addition, the current output from the terminal b of the current matrix cell 1 is supplied to the resistor 45 through the current mirror circuit 53. Thus, the output Y produces the analog signal A or B.

On the other hand, to output the analog signals A and B by D/A converting the 9-bit digital signals A and B, the control circuit 7 supplies the output section 8 with the switching control signal indicating that.

In response to the switching control signal, the P-channel transistor 51a of the pair of differential transistors 51 is brought into conduction. In contrast, because of the inverter 43 connected to its gate, the P-channel transistor 51b is brought out of conduction.

Accordingly, the current output from the terminal a of the current matrix cell 1 is supplied to the resistor 44 through the current mirror circuit 52. Thus, the output X produces the analog signal A.

In addition, the current output from the terminal b of the current matrix cell 1 is supplied to the resistor 45 through the current mirror circuit 53. Thus, the output Y produces the analog signal B.

As described above, the present embodiment 7 can remove the switches 18 and 19 and the like from the passage of the current flowing in the output sections 8 and 9. Thus, it offers an advantage of being able to eliminate the adverse effect of the resistance of the switches 18 and 19 and the like on the D/A converters.

Embodiment 8

Although the foregoing embodiment 7 does not mention in particular, the control circuit 7 can control the pair of differential transistors 51 and current mirror circuits 61 and 62 (see, FIG. 13) in accordance with the number of divisions of the current matrix cell 1, so that the voltages the output sections 8 and 9 produce become constant when the digital signals take a maximum value.

Figure 13:
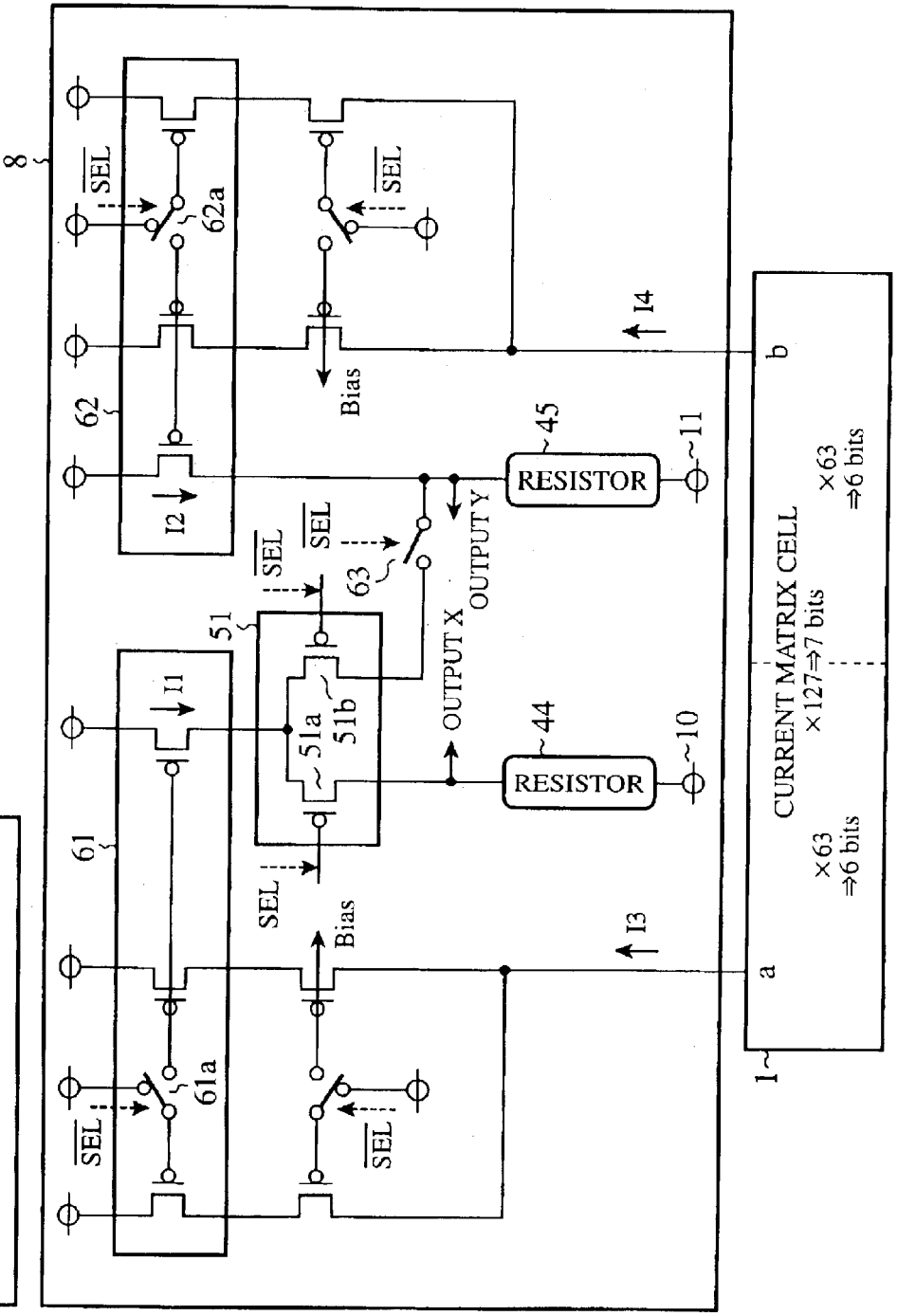
FIG. 13 is a circuit diagram showing a configuration of an embodiment 8 of the D/A converter in accordance with the present invention.

More specifically, as shown in FIG. 13, the output section 8 can be configured using a pair of differential transistors 51 (51a and 51b), current mirror circuits 61 and 62, a switch 63 and the like. Although the output section 9 is not shown in FIG. 13, it has the same configuration as the output section 8. In FIG. 13, the adders 8a and 8b of the output section 8 are omitted for the sake of simplicity.

In FIG. 13, to output the analog signal A or B by D/A converting the 10-bit digital signal A or B, the control circuit 7 supplies the output section 8 with an OFF (High) switching control signal SEL.

In response to the switching control signal, the switches 61a and 62a of the current mirror circuits 61 and 62, the switch 63 and a P-channel transistor 51b are brought into conduction, and a P-channel transistor 51a is brought out of conduction.

Accordingly, the current I1 (I1=I3/2), half of the current I3 output from the terminal a of the current matrix cell 1, is supplied to the resistor 45 via the P-channel transistor 51b and switch 63.

In addition, the current I2 (I2=I4/2), half of the current I4 output from the terminal b of the current matrix cell 1, is supplied to the resistor 45. Here, the currents I3 and I4 are the currents when the digital signal A or B is at the maximum.

As a result, the resistor 45 is supplied with the currents I1 and I2 (I1+I2=I3/2+I4/2=I3=I4). Thus, the output Y produces the analog signal A or B.

On the other hand, to output the analog signals A and B by D/A converting the 9-bit digital signals A and B, the control circuit 7 supplies the output section 8 with an ON (Low) switching control signal SEL.

In response to the switching control signal, the switches 61a and 62a of the current mirror circuits 61 and 62, the switch 63 and the P-channel transistor 51b are brought out of conduction, and the P-channel transistor 51a is brought into conduction.

Accordingly, the resistor 44 is supplied with the current I1 (I1=I3) corresponding to the current I3 output from the terminal a of the current matrix cell 1 via the P-channel transistor 51a. Thus, the output X produces the analog signal A.

In addition, the resistor 45 is supplied with the current I2 (I2=I4) corresponding to the current I4 output from the terminal b of the current matrix cell 1. Thus, the output Y produces the analog signal B.

As described above, the present embodiment 8 offers an advantage of being able to equalize the amplitude of the analog signal corresponding to the maximum 10-bit digital signal with the amplitudes of the analog signals corresponding to the maximum 9-bit digital signals.

What is claimed is:

1. A D/A converter for converting M digital signals out of N digital signals into M analog signals simultaneously, where M and N are integers equal to or greater than two satisfying relationship $N \geq M$, said D/A converter comprising:

a current matrix cell for outputting, when receiving specified bits constituting the M digital signal, M currents each of which has a magnitude corresponding to a bit value of the specific bits constituting one of the M digital signals;

M weighting cells selected out of N weighting cells for outputting, when receiving remaining bits constituting the M digital signals, M currents each of which has a magnitude corresponding to a bit value of the remaining bits constituting one of the M digital signals;

a control circuit for dividing said current matrix cell in accordance with the number M of the digital signals to be D/A converted, for supplying said current matrix cell after the division with the specified bits constituting the M digital signals, and for supplying only the M weighting cells out of the N weighting cells with the remaining bits constituting the M digital signals; and an output section for calculating sums of the M output currents of the current matrix cell after the division and the M output currents of the M weighting cells, and for converting M resultant sums into M voltages to be output as the analog signals.

2. The D/A converter according to claim 1, wherein said N weighting cells each comprise a same number of constant current sources.

3. The D/A converter according to claim 1, wherein said N weighting cells each comprise a different number of constant current sources.

4. The D/A converter according to claim 1, wherein said output section comprises internal resistances for converting the M resultant sums into the M voltages, and switching means for switching the internal resistances.

5. The D/A converter according to claim 4, wherein said control circuit controls said switching means to switch values of the internal resistances of the output section in accordance with the number of divisions of said current matrix cell, to keep the voltages constant of the M analog signals said output section produces when the M digital signals are maximum.

6. The D/A converter according to claim 4, wherein said switching means comprises pairs of differential transistors.

7. The D/A converter according to claim 4, wherein said switching means comprises pairs of differential transistors and current mirror circuits.

8. The D/A converter according to claim 7, wherein said control circuit controls said pairs of differential transistors and said current mirror circuits in accordance with the number of divisions of said current matrix cell to keep the voltages constant of the M analog signals said output section produces when the M digital signals are maximum.

* * * * *